United States Patent [19]

Miller et al.

[11] Patent Number: 4,698,497

[45] Date of Patent: Oct. 6, 1987

[54] DIRECT CURRENT MAGNETO-OPTIC CURRENT TRANSFORMER

[75] Inventors: Robert C. Miller, Salem Township, Westmoreland County; Juris A. Asars, Murrysville Boro, both of Pa.

[73] Assignee: Westinghouse Electric Corp., Pittsburgh, Pa.

[21] Appl. No.: 866,016

[22] Filed: May 22, 1986

[51] Int. Cl.$^4$ .................. G01D 5/34; G01R 31/00; G02F 1/01; G01J 4/00

[52] U.S. Cl. .................. 250/231 R; 250/225; 324/96; 356/368

[58] Field of Search ............ 324/96, 244; 250/231 R, 250/225; 356/364, 368, 370

[56] References Cited

U.S. PATENT DOCUMENTS

| | | | |
|---|---|---|---|
| 3,707,329 | 12/1972 | Jaecklin et al. | 324/96 |
| 3,743,929 | 6/1973 | Lesueur | 324/96 |
| 3,753,101 | 8/1973 | Aumont | 324/96 |
| 3,769,584 | 10/1973 | Iten et al. | 324/96 |
| 4,243,936 | 1/1981 | Papp et al. | 324/96 |
| 4,554,449 | 11/1985 | Taniuchi et al. | 324/96 |
| 4,564,754 | 1/1986 | Sato et al. | 324/96 |
| 4,613,811 | 9/1986 | Vaerewyck et al. | 324/96 |

Primary Examiner—Edward P. Westin
Assistant Examiner—J. L. Ruoff
Attorney, Agent, or Firm—Daniel C. Abeles

[57] ABSTRACT

A drift free magneto-optic current transformer for measuring an electric current which may include a d-c component in which two orthogonally polarized light beams are passed through a magneto-optic element operating as a Faraday rotator to rotate the beams through an angle dependent upon the magnitude of the d-c current. An analyzer, oriented with two orthogonal polarization axes set at +45 degrees and −45 degrees with respect to the plane of polarization of the first input light beam and at −45 degrees and +45 degrees with respect to the plane of polarization of the second input light beam, splits each emerging light beam into two output light beams which are converted into $a_1$ and $b_1$, and $a_2$ and $b_2$ electrical signals in response to the first and second input light beams respectively. By maintaining the signal $(a+b)_1$ equal to $(a+b)_2$, and by maintaining $(a-b)_1+(a-b)_2$ equal to zero, an output signal $(a-b)_1-(a-b)_2$ proportional to the magnitude of the d-c current, and free from drift due to changes in the attenuation characteristics of the optical components, is obtained without the necessity of dividing by a variable.

10 Claims, 3 Drawing Figures

DIRECT CURRENT MAGNETO-OPTIC CURRENT TRANSFORMER

CROSS REFERENCE TO RELATED APPLICATIONS

Our commonly owned U.S. patent application Ser. No. 717,989 filed on Mar. 29, 1985 entitled Drift Compensation Technique for a Magneto-Optic Current Sensor.

BACKGROUND OF THE INVENTION

1. Field of the Invention

This invention relates to magneto-optic devices for sensing electric current and more particularly to such devices for measuring d-c currents which are compansated for drift attributable to variations in the properties of the optical components.

2. Prior Art

Magneto-optic current transformers have found widespread use as sensors for measuring large electric currents. In such devices, polarized light is passed through a sensor made of magneto-optic material where the plane of polarization is rotated through a small angle in response to the current being measured in accordance with a phenomenon known as the Faraday effect. Preferably, the sensor encircles the conductor carrying the current so that relative positioning of the sensor and conductor is not critical. The light beam is analyzed after is has passed through the sensor to determine the degree of rotation of the plane of polarization and therefore, the magnitude of the current.

In many current sensors, an analyzer splits the emerging polarized light into two orthogonal components, one rotated +45 degrees and other −45 degrees from the plane of polarization of the injected light. These two light components are converted by photodetectors into electric signals which are amplified in separate channels to produce signals which are typically labeled "a" and "b". The amount of rotation of the plane of polarization of the light beam is determined in an electronic module which electrically generates an output $(a-b)/(a+b)$ which is proportional to the magnitude of the current. This output is independent of changes in the intensity of the light source and changes in attenuation of the optical components up to the analyzer. However, any changes in the relative effective gains of the parallel signal channels through the analyzer to the electronic module can produce a sizable error in the measured current. While it would be possible to periodically turn off the current and adjust the gain of one of the signal channels so that the output of the electronic module is zero, such a procedure is not practical in most applications of these sensors, such as in monitoring the current in a high voltage transmission system.

In order to provide drift free measurement of direct current signals, it is necessary to generate sufficient information to determine four quantities representative of the two orthogonal components of the polarized source and of the rotation due to the current. In our copending application Ser. No. 717,989 filed on Mar. 29, 1985, referred to above, the necessary information is generated by alternatively passing light of two different wavelengths through the sensor, and processing in separate channels electrical signals generated from the two orthogonal components of each of the emerging light beams. Since the Verdet constant of the magneto-optic sensor is a function of wavelength, the gain of the two processing channels is adjusted to maintain $E_1V_2 = E_2V_1$ where $V_1$ and $V_2$ are the Verdet constants and $E_1$ and $E_2$ are the quantities $(a-b)/(a+b)$ at the two wavelengths respectively.

U.S. Pat. No. 4,243,936 discloses a magneto-optic current transformer in which an electrically controlled modulator alternately polarizes, in two orthogonal directions, light passed through the magneto-optic element. A photodetector in a single output channel converts the emerging alternately polarized light beam into an electrical signal which is demodulated to generate signals representative of the rotation of the alternately polarized light beam due to the current. Such a system, however, does not provide sufficient information to eliminate the effects of drift attributable to differences in the properties of the modulator in the two planes of polarization. This system also requires that the modulator, with its electrical interface, be located in close proximity to the magneto-optic sensor which is a disadvantage in a practical application of such a detector.

U.S. Pat. No. 3,743,929 discloses a magneto-optical device for measuring the current in a transmission line in which two light beams are passed in opposite directions through an optical path which includes a magneto-optical element between two polarizers which have their axes of polarization set at an angle to one another. Light from a single source provides the two input beams through optical fibers and optical fibers also guide the emerging beams to separate photodetectors for conversion to electrical signals which are subtracted to generate the output signal proportional to current. No provision is made, however, to accommodate for variations in the attenuation characteristics of the optical fibers which are very sensitive to movment and vibration, and for variations in photodetector sensitivity.

SUMMARY OF THE INVENTION

In accordance with the present invention, two orthogonally polarized input light beams are alternatively passed through a magneto-optic sensor operating as a Faraday rotator to rotate the planes of polarization of the input light beams as a function of the magnitude of a d-c as well as an a-c current. An analyzer splits the emerging light beams into two orthogonally polarized output light beams. The analyzer is oriented so that the polarization axis of one of these outputs is at an angle of +45 degrees with respect to the plane of polarization of the first input light beam and −45 degrees with respect to the plane of polarization of the second input light beam, while the polarization axis of the second output light beam is oriented at −45 degrees and +45 degrees respectively with regard to the planes of polarization of the first and second input light beams. The two output light beams are converted into electrical signals by photodetectors in an "a" channel and a "b" channel respectively to alternately generate $a_1$ and $b_1$ electrical signals in response to the first input light beam, and $a_2$ and $b_2$ electrical signals in response to the second input light beam. These signals are demultiplexed and utilized to generate signals $(a+b)_1$, $(a-b)_1$, $(a+b)_2$ and $(a-b)_2$. The relative gains of the channels "a" and "b" are adjusted to maintain $(a-b/a+b)_1 + (a-b/a+b)_2$ equal to zero to eliminate the effects of any changes in the attenuation in the optical components. By adjusting the relative intensities of the two input light beams to maintain $(a+b)_1$ equal to $(a+b)_2$, so that the denominations in the above calculation are constants, the need to divide by a variable is eliminated. The output, which is proportional to the magnitude of the current being measured, is then equal to $(a-b)_1 - (a-b)_2$.

The invention embraces both the apparatus and method described for generating a signal proportional to the magnitude of the d-c or a-c current, which is free from the effects of changes in the attenuation of the optical components, as well as changes in the efficiencies of the light emitters and detectors.

BRIEF DESCRIPTION OF THE DRAWINGS

A full understanding of the invention can be gained from the following description when read in conjunction with the accompanying drawings in which.

DESCRIPTION OF THE PREFERRED EMBODIMENT

Figure 1:
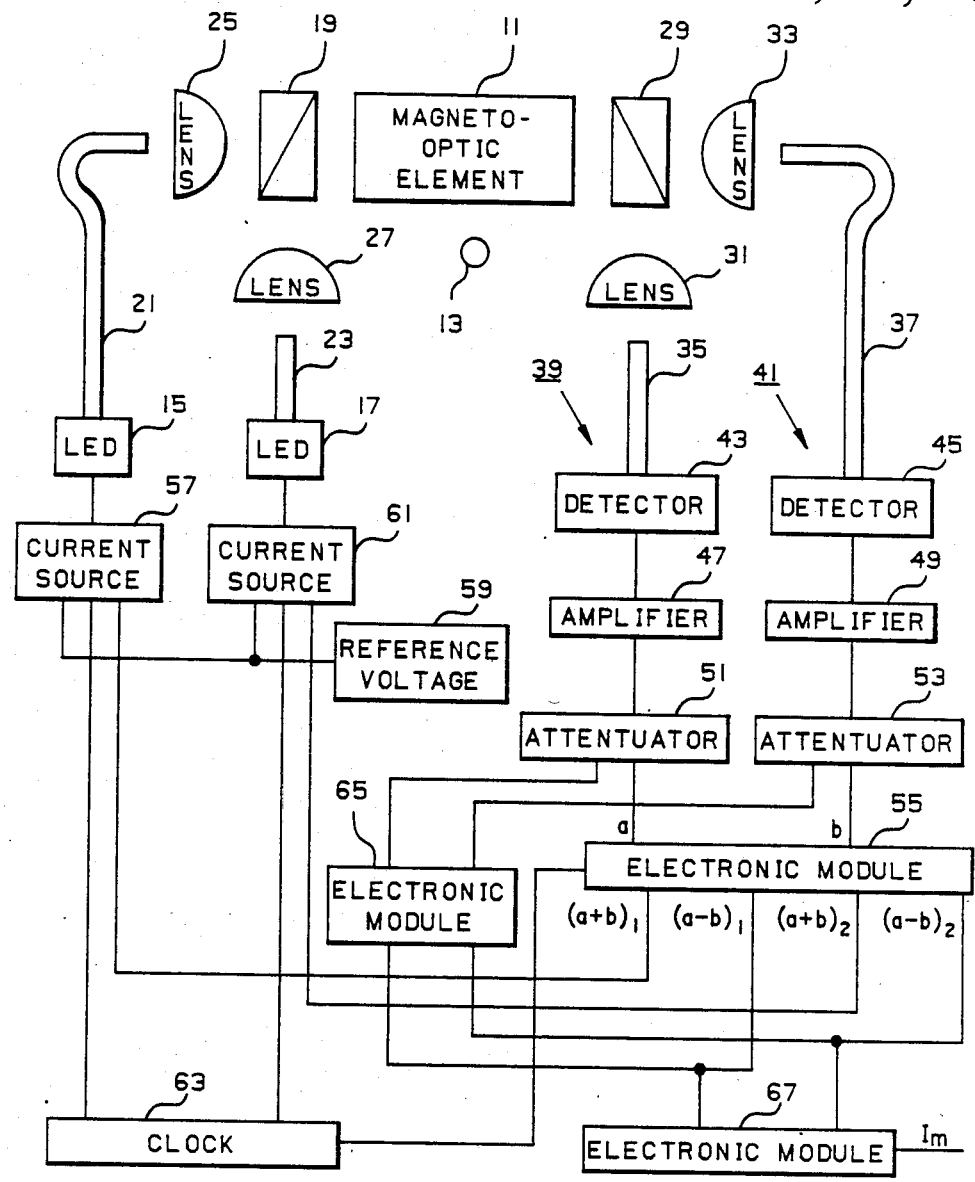
FIG. 1 is a schematic diagram in block diagram form of a current transformer incorporating the invention.

As shown in FIG. 1, the invention utilizes a known magneto-optic element 11 which is in close proximity to a conductor 13 carrying a current to be measured. The magneto-optic element 11 operates as a Faraday rotator to rotate the plane of polarization of light passed through the element through a small angle which is a function of the magnitude of the instantaneous current. Preferably a magneto-optic element, which passes the polarized light beam completely around the conductor 13 is used so that the measurement is not dependent upon the precise position of the element relative to the conductor. Magneto-optic elements of other physical configurations, such as a straight bar could be used, but in such arrangements, precise fixing of the relative positions of the element and conductor is essential to accurate measurements.

In the construction of precision direct current sensors for use in applications requiring long term stability, it is necessary to automatically compensate for any drift. The present system utilizes two optical inputs and two outputs to achieve this end. The two optical inputs are alternately generating light beams of substantially the same wavelength which are orthogonally, linearly polarized. In the preferred form of the invention, the two orthogonally polarized light beams are produced by two LEDs 15 and 17. Light from the LEDs 15 and 17 is passed to a polarizer 19 through optic fiber light guides 21 and 23 respectively. These light guides permit location of the LEDs with the remainder of the sensor electronics at a location remote from the measurement site, which is very desirable in many applications. The attenuation characteristics of the optic fiber light guides are dependent upon the configuration of the path assumed by each optic fiber and are also affected by such conditions as vibration or other movement. Our sensor, however, cancels out such affects along with the effects of radiation. The present sytem, therefore, is especially suitable for instrumentation in applications subject to high levels of radiation such as in nuclear reactors. The optic fibers permit the electronics, which are subject to the long term affects of radiation, to be located outside the areas of high radiation, yet the system provides a stable, drift free response which is essential to accurate measurement.

The diverging light emerging from the light guides 21 and 23 is converted to parallel light by collimating lenses 25 and 27 before being passed to the polarizer 19. The polarizer 19 linearly polarizes the two input light beams with the plane of polarization of the beam from light guide 23 rotated 90 degrees to that of the beam from light guide 21. The alternately generated orthogonally polarized input light beams from the polarizer 19 are passed through the magneto-optic element 11 wherein they are each rotated through an angle dependent upon the magnitude of the current in conductor 13.

Figure 2:
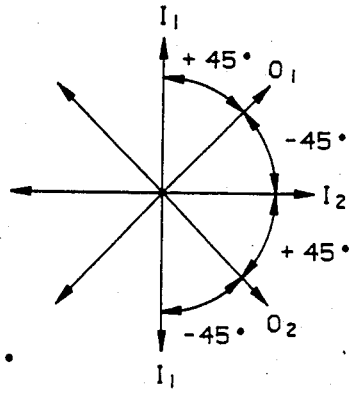
FIG. 2 is a diagram illustrating the orientation of the planes of polarization of the polarizer and analyzer in the current transformer of FIG. 1.

The light beams alternately emerging from the magneto-optic element 11 are passed to an analyzer 29 which splits each of the output beams into two orthogonally polarized components. As illustrated in FIG. 2, the analyzer 29 is oriented such that the polarization axes $O_1$ and $O_2$ of the two output beams are at angels of +45 degrees and −45 degrees with respect to the polarization axis $I_1$ of the input light beam from light guide 21 and at angles of −45 degrees and +45 degrees with respect to the polarization axis $I_2$ of the input light beam from light guide 23.

Collimating lenses 31 and 33 focus the two output light beams emerging from the analyzer 29 into two optic fiber light guides 35 and 37 of "a" and "b" output channels 39 and 42 respectively. The respective channels 39 and 41 include, in addition to the collimating lenses 31, 33 and light guides 35, 37, photodetectors 43 and 45 which convert the output light beams into electrical signals which are amplified by amplifiers 47 and 49 and selectively attenuated relative to one another by attenuators 51 and 53 to produce signals "a" and "b". The electrical output signals "a" and "b" are proportional to the two optical outputs of the analyzer 19 for each of the input light beams. As to a single input light beam, if the effective gains of the two output channels 39 and 41 are equal, and assuming a magneto-optic element 11 which forms a closed path around the conductor 13, it can be shown that $$(a-b)/(a+b) = \sin 2\theta = \sin (2VI) \sim 2VI$$

where I is the current through conductors 13, $\theta$ is the small angle through which the plane of polarization of the light beam is rotated as a result of the current I, and V is the Verdet constant of the material forming of the magneto-optic element 11. Thus, if an electronic module were provided which would compute this ratio, the output would be proportional to current and would be independent of changes in the properties of the single light source and changes in attenuation of the optic couplings up to the analyzer. However, any change in the effective gain of the two channels 39 and 41 comprised of components 31, 35, 43, 47 and 51; and 33, 37, 45, 49 and 53, as might be caused by changes in attenuation of the optical component or properties of the detectors, would result in an error in the current measurement. It can be shown that for a 10% difference $\delta = 0.1$ in the gains for the two channels, and a current at the upper end of the linear range defined by the relationship where $\sin 2\theta = 2\theta$ and $2VI = 0.1$, there would be a 50% error in the measured current, and larger errors would result at lower currents. Therefore, unless one can assure that the gains of the two channels 39 and 41 are always very nearly equal, a system using a single input light beam and two output channels cannot be used for reliabe measurement of direct currents.

Until the present invention, and out system which uses light of two different wavelengths described in our copending application Ser. No. 717,989 filed on Mar. 29, 1985 and referred to above under Cross-References to Related Applications, the only method of checking the gains of the two channels was to turn off the current periodically and adjust one of the gains so that the quantity $(a-b)(a+b)$ was zero. Such a procedure is not acceptable for most potential applications of magneto-optic current transformers to direct current measurement.

By alternating using orthogonal polarized light beams, the quantity $(a-b)/(a+b)$ can be generated for each polarization. Under these conditions, the quantity $(a-b)/(a+b)$ for an input form optic fiber 21 is given by:

$$\left(\frac{a-b}{a+b}\right)_1 = 2VI - \left(\frac{\delta}{2}\right)[1-(2VI)^2] + \left(\frac{\delta}{2}\right)^2(1-2VI)[1-(2VI)^2]$$

and for an input from optic fiver 23:

$$\left(\frac{a-b}{a+b}\right)_2 = -2VI - \left(\frac{\delta}{2}\right)[1-(2VI)^2] + \left(\frac{\delta}{2}\right)^2(1+2VI)[1-(2VI)^2]$$

where $\delta$, $V$ and $I$ are as defined above and assuming a closed loop configuration of the sensor. From this, it can be easily shown that:

$$\left(\frac{a-b}{a+b}\right)_1 - \left(\frac{a-b}{a+b}\right)_2 = 4VI\left[1-\left(\frac{\delta}{2}\right)^2\right]$$

and $$\left(\frac{a-b}{a+b}\right)_1 + \left(\frac{a-b}{a+b}\right)_2 = -\delta$$

Thus, if "a" ad "b" are measured first with an input from light guide 21 and $(a-b/a+b)_1$ is calculated, and then "a" and "b" are measured with an input from light guide 23 and $(a-b/a+b)_2$ is calculated, the difference between these two quantities is directly proportional to current and the sum of the two quantities is proportional to the fractions gain difference. Such a device is very tolerant of gain inbalance in that a 10% inbalance results in only a 0.25% error in the measured current.

The remainder of the sensor shown in FIG. 2 provides means for generating the output which is proportional to current, for forcing the fractional gain difference between channels to zero, and for alternately energizing the LED, 15 and 17 in a manner which eliminates the need to perform division by a variable in achieving the first two mentioned functions. To these ends, the "a" and "b" signals are applied to an electronic module 55 which contains a demultiplexer and summing circuits to generate the four outputs $(a-b)_1$, $(a+b)_1$, $(a-b)_2$ and $(a+b)_2$. The $(a+b)_1$ signal is fed to a current source 57 where it is compared to a reference voltage from a reference voltage source 59. This comparison is used by the current source 57 to generate an energizing current for LED 15 which maintains the signal $(a+b)_1$ constant. Similarly, a current source 61 compares $(a+b)_2$ to the same reference voltage and regulates the energizing current supplied to LED 17 as a function of this comparison to maintain the signal $(a+b)_2$ constant. A clock or timing module 63 provides alternating signals to current sources 57 and 61 to control alternate energization of the LEDs 15 and 17. These timing signals are also applied to the demulitplexer in the electronic module 55.

Since the quantities $(a+b)_1$ and $(a+b)_2$ are held constant, it is not necessary to perform an actual division to calculate the quantities $(a-b/a+b)_1$ and $(a-b/a+b)_2$. Simply multiplying $(a-b)_1$ and $(a-b)_2$ by a constant is sufficient, and this constant can be part of the calibration constant of the system. Thus another electronic module 65 computes the gain difference $\delta$ between the "a" and "b" channels merely by adding the signals $(a+b)_1$ and $(a+b)_2$, and generates error signals which are applied to the variable attenuators 51 and 53 which in turn alter the effective gains of the two channels until they are equal. Finally, an electronic module 67 computes the difference between $(a-b)_1$ and $(a-b)_2$ and provides an output signal, $O_I$, which is proportional to current in the conductor 13 and is independent of any changes in the attenuation of the optical components. Thus, a drift free magneto-optic current transformer has been disclosed which operates from d-c to a frequency below the frequency of clock module 63.

In the construction of the sensor, special care must be taken in mounting the components so that the effective angle between the polarizer 19 and analyzer 29 are exactly ±45 degrees. Any deviation from this value would appear as an offset in the output. A small constant offset could be tolerated and considered as part of the calibration. However, a changing offset which would result from birefringence associated with changing strains in the magneto-optic element; such as might be caused by changes in temperature, could not be tolerated. Care must be taken in mounting the components so that no large strains appear when the sensor is subjected to normal operating conditions.

Figure 3:
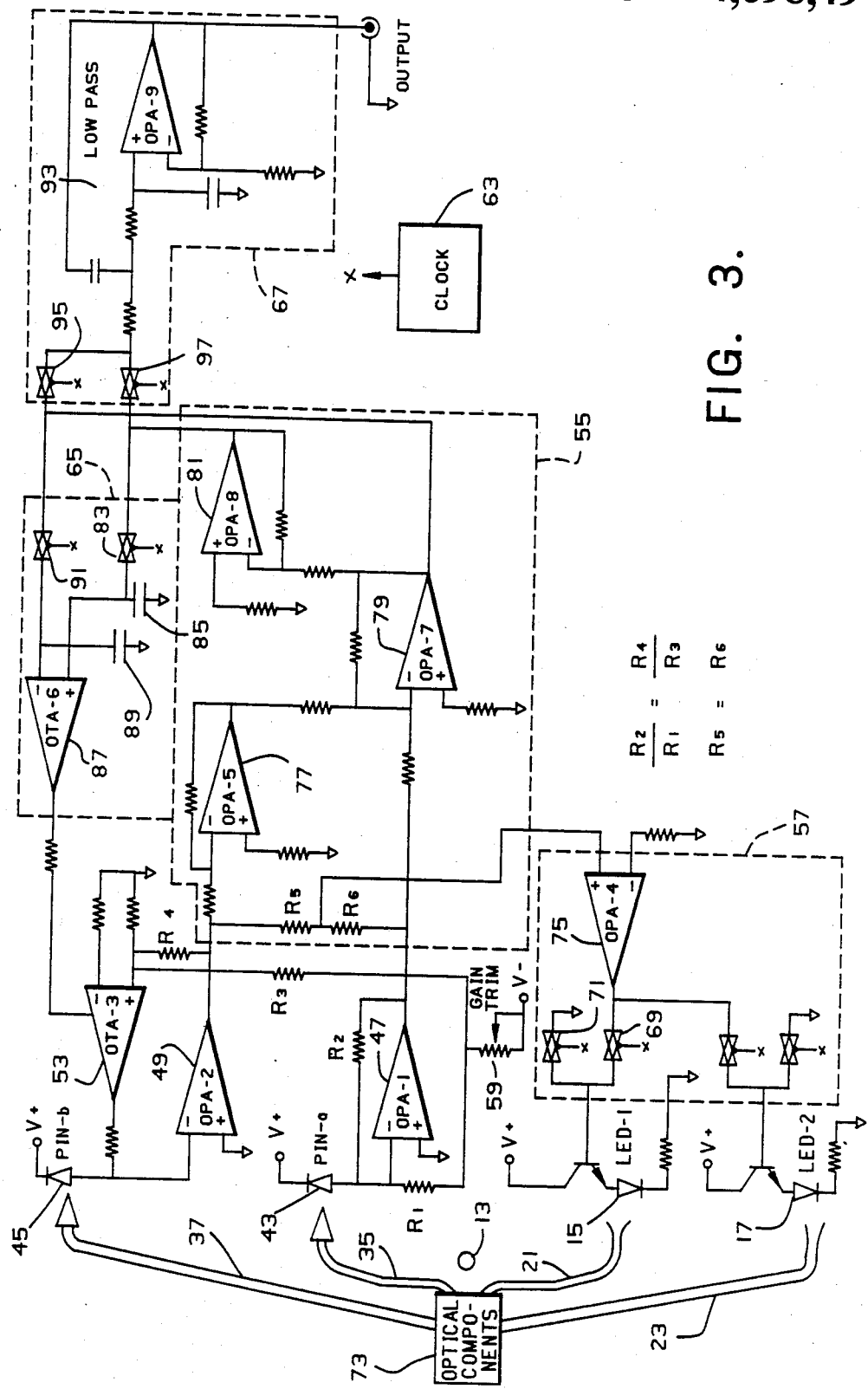
FIG. 3 is a schematic circuit diagram of simplified circuit implementing the current transformer illustrated in FIG. 1.

A simplified circuit to implement the system shown in FIG. 1 is illustrated in FIG. 3. The clock 63 generates repetitive timing signals which operate a number of analog switches such as the switches 69 and 71 which control LED 15. With the switch 69 in the ON state, LED 15 is turned ON. When switch 71 is ON, and switch 69 is OFF, LED 15 is OFF. The other analog switches which have a circle on the control lead, like switch 71, are ON when LED 17 is ON, while the switches without this symbol are ON when LED 15 is ON. The portions of the circuit of FIG. 3 which correspond to the components in the system of FIG. 1 are identified by the same reference characters, with the optical components comprising the polarizer 19, the magneto-optic element 11 and the analyzer 29 being represented collectively by the block 73. The operational amplifier 75, which forms a part of the common current source 57 for the LEDs 15 and 17, drives the error between the sum of the signals $a+b$ and the reference voltage generated by the potentiometer 59 to zero, by adjusting the output of the LED that is turned on so that $(a+b)_1$ and $(a+b)_2$ and held equal to a constant, and therefore equal to each other.

The operational amplifier 77 inverts the $-b$ signal generated by operational amplifier 49 for summing with the $-a$ signal through the inverting input of operational amplifier 79 to generate $(a-b)$, which in turn is inverted by operational amplifier 81 to produce $-(a-b)$. With the analog switch 83 ON when LED 15 is turned ON, capacitor 85 stores $-(a-b)_1$ for comparison in operational amplifier 87 with $(a-b)_2$ which is stored in capacitor 89 through switch 91 when LED 17 is ON. The output of operational amplifier 87 adjusts the gain of operational amplifier 53 which in turn adjusts the gain of the operational amplifer 49 to maintain $(a-b)_1$ equal to $(a-b)_2$.

The low pass filter 93 which forms the output circuit 67 adds $(a-b)_1$ gated by switch 95 to $-(a-b)_2$ controlled by switch 97 to generate the output signal $(a-b)_1-(a-b)_2$, which is proportional to the magnitude of the measured current.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A magneto-optic current transformer system comprising:
    a conductor carrying an electric current which can include a d-c component; and
    a current detector for measuring the magnitude of the current flowing through the conductor, said current detector comprising:
    a magneto-optic current sensor operating as a Faraday rotator to rotate the plane of polarization of light passed therethrough as a function of the magnitude of the current in said conductor;
    light source means for generating a first linearly polarized input light beam and a second linearly polarized input light beam with its plane of polarization orthogonal to the plane of polarization of said first input light beam;
    activating means for activating said light source means to alternately pass said orthogonally polarized first and second input light beams through said magneto-optic sensor;
    analyzer means for splitting light passed through the magneto-optic sensor into two orthogonal output beams, one of which has its plane of polarization oriented at about $+45$ degrees with respect to the plane of polarization of the first polarized input light beam and about $-45$ degrees with respect to the second, and the other output beam of which has its plane of polarization oriented at $-45$ degrees with respect to the plane of polarization of the first polarized input light beam and $+45$ degrees with respect to the second;
    an "a" output channel including a photodetector for converting said one output light beam into an electric signal, "a";
    a "b" output channel including a photodetector for converting said other output light beam into an electrical signal "b";
    a first computational circuit for generating from said "a" and "b" signals, $(a-b)_1$ and $(a+b)_1$ signals in response to the first input light beam, and $(a-b)_2$ and $(a+b)_2$ signals in response to the second input light beam;
    means responsive to the $(a+b)_1$ and $(a+b)_2$ signals for adjusting said light source means to maintain $(a+b)_1$ equal to $(a+b)_2$;
    means responsive to the $(a-b)_1$ and $(a-b)_2$ signals for adjusting the relative gains of said "a" and "b" channels to maintain $(a-b)_1+(a-b)_2$ equal to zero; and
    means for generating a signal $(a-b)_1-(a-b)_2$ as an output signal proportional to the magnitude of the current in said conductor.

2. In combination with a magneto-optic element operating as a Faraday rotator to rotate the plane of polarization of polarized light passed through the element as a function of the magnitude of an electric current which may include a d-c component, an analyzer which splits the light emerging from the magneto-optic element into two orthogonal output beams and photodetectors which convert the output beams into electrical signals "a" and "b" such that a signal $(a-b/a+b)$ is proportional to the current;
    means for alternately passing orthogonally, polarized first and second input light beams through the magneto-optic element to generate electrical signal $a_1$ and $b_1$ in response to said first input light beam and $a_2$ and $b_2$ in response to the second input light beam; and
    means for generating signals $(a-b)_1$, $(a+b)_1$, $(a-b)_2$ and $(a+b)_2$, for maintaining $(a+b)_1$ and $(a+b)_2$ constant, for maintaing $(a-b)_1+(a-b)_2$ equal to zero, and for generating an output signal $(a-b)_1-(a-b)_2$ proportional to said current.

3. the combination of claim 2 wherein the means for maintaining $(a-b)_1+(a-b)_2$ equal to zero includes means for applying an adjustable gain to at least one of the signals a, b, said gain being adjusted as a function of the magnitude of the signal $(a-b)_1+(a-b)_2$.

4. The combination of claim 3 wherein the means for maintaining $(a+b)_1$ and $(a+b)_2$ constant include means for adjusting the intensity of the first input beam as a function of the error between $(a+b)_1$ and said reference signal.

5. The combination of claim 4 wherein said means for alternately passing orthogonally polarized input light beams through said magneto-optic element include: first and second light sources, control means for alternately turning on said light sourced, and polarizing means operable to orthogonally polarize the light from said first and second light sources.

6. The combination of claim 5 wherein the means for adjusting the intensities of the first and second light beams include meeans for adjusting the intensities of the respective light sources.

7. A method of providing drift compensation in a magneto-optic current measuring system including a magneto-optic sensor and an analyzer which splits the light beam emerging from the magneto-optic sensor into two orthogonal beams, said method comprising the steps
    alternately passing orthogonally polarized input light beams through said magneto-optic sensor;
    splitting the light beams emerging from the magneto-optic sensor into two orthogonally polarized output light beams, one having its plane of polarization set at +45 degrees and −45 degrees, and the other having its plane of polarization set at −45 degrees and +45 degrees with respect to the planes of polarization of the first and second input beams respectively;

converting the first output beam into an electrical signal, "a", in an "a" channel;

converting the second output beam into an electrical signal, "b", in a "b" channel;

generating the signals $(a-b)_1$ and $(a+b)_1$ from said "a" and "b" signals in response to the first input light beam and the signals $(a-b)_2$ and $(a+b)_2$ in response to the second input light beam;

maintaining the signal $(a+b)_1$ equal to the signal $(a+b)_2$ and maintaining a signal $(a-b)_1+(a-b)_2$ equal to zero; and generating a signal $(a-b)_1-(a-b)_2$ as an output signal proportional to the magnitude of the current through the conductor.

8. The method of claim 7 wherein the step of maintaining $(a+b)_1$ equal to $(a+b)_2$ comprises adjusting the relative intensities of the input light beams.

9. The method of claim 8 wherein the step of maintaining $(a-b)_1+(a-b)_2$ equal to zero comprises adjusting the relative gains of the channels "a" and "b".

10. The method of claim 8 wherein said orthogonal polarized input light beams are generated by first and second separate light sources which generate light of substantially the same wavelength, and wherein said step of adjusting the intensities of the input light beams comprises controlling the intensity of the light generated by the first light source as a function of the difference between the magnitude of the signal $(a+b)_1$ and a reference signal, and controlling and intensity of the light generated by the second light source as a function of the difference between the magnitude of the signal $(a+b)_2$ and said reference signal.

* * * * *